(12) United States Patent
Koyasu et al.

(10) Patent No.: US 9,948,285 B2
(45) Date of Patent: Apr. 17, 2018

(54) DRIVE CONTROL DEVICE

(71) Applicant: DENSO CORPORATION, Kariya-city, Aichi-pref. (JP)

(72) Inventors: Takahisa Koyasu, Kariya (JP); Yasuyuki Maeda, Kariya (JP)

(73) Assignee: DENSO CORPORATION, Kariya (JP)

( * ) Notice: Subject to any disclaimer, the term of this patent is extended or adjusted under 35 U.S.C. 154(b) by 280 days.

(21) Appl. No.: 15/045,763

(22) Filed: Feb. 17, 2016

(65) Prior Publication Data

US 2016/0269015 A1 Sep. 15, 2016

(30) Foreign Application Priority Data

Mar. 11, 2015 (JP) .................................. 2015-048298

(51) Int. Cl.
| | |
|---|---|
| *H03K 7/08* | (2006.01) |
| *H01H 47/32* | (2006.01) |
| *H02P 29/032* | (2016.01) |
| *H02P 27/08* | (2006.01) |
| *H02H 3/08* | (2006.01) |
| *H02M 1/32* | (2007.01) |

(52) U.S. Cl.
CPC ............ *H03K 7/08* (2013.01); *H01H 47/325* (2013.01); *B60L 2240/429* (2013.01); *H02H 3/08* (2013.01); *H02M 1/32* (2013.01); *H02P 27/08* (2013.01); *H02P 29/032* (2016.02)

(58) Field of Classification Search
USPC ...................................... 361/18, 86–87, 160
See application file for complete search history.

(56) References Cited

U.S. PATENT DOCUMENTS

| | | | | |
|---|---|---|---|---|
| 5,647,387 A | * | 7/1997 | Tsutsui ................. | H01H 47/325 137/1 |
| 5,930,103 A | * | 7/1999 | Heck ......................... | F01L 9/04 123/478 |
| 2007/0279948 A1 | | 12/2007 | Shin et al. | |
| 2011/0316449 A1 | | 12/2011 | Imanaka | |

FOREIGN PATENT DOCUMENTS

| | | |
|---|---|---|
| JP | 2003-088131 A | 3/2003 |
| JP | 2007-043818 A | 2/2007 |
| JP | 2010-061481 A | 3/2010 |
| JP | 2010-263776 A | 11/2010 |
| JP | 2012-165486 A | 8/2012 |
| JP | 2013-247574 A | 12/2013 |

* cited by examiner

*Primary Examiner* — Danny Nguyen
(74) *Attorney, Agent, or Firm* — Posz Law Group, PLC

(57) ABSTRACT

A drive control device includes: an input unit of a command; and a control unit setting a period for rising a current in an inductive load to first and third periods in first and second commands, and setting a period for falling the current to second and fourth periods in the first and second commands, respectively. When the first command is changed to the second command, and at least one middle PMW pulse is disposed between a forward PWM pulse corresponding to the first command and an after PWM pulse corresponding to the second command, the control unit sets fifth and sixth periods in the middle PWM pulse corresponding to the first and second periods of the forward PWM pulse to a length between the first and second periods in the forward PWM pulse and the third and fourth periods in the after PWM pulse, respectively.

7 Claims, 11 Drawing Sheets

DRIVE CONTROL DEVICE

CROSS REFERENCE TO RELATED APPLICATION

This application is based on Japanese Patent Application No. 2015-48298 filed on Mar. 11, 2015, the disclosure of which is incorporated herein by reference.

TECHNICAL FIELD

The present disclosure relates to a drive control device for controlling the driving of an inductive load.

BACKGROUND

For example, when the energization of an inductive load such as a solenoid of a hydraulic pump is controlled, a PWM drive control may be performed. In that case, a control unit generates a PWM pulse, and controls the energization of the inductive load according to the PWM pulse. However, when the control is performed at a fixed frequency, there may arise such a problem that an audible sound may occur during the control according to a structure of the actuator.

To cope with the problem on the sound described in the description of the related art, it has been confirmed that quietness can be improved by frequency spreading of a PWM pulse. However, when the frequency of the PWM pulse is spread to feedback control the inductive load such as the solenoid, as schematically illustrated in FIG. 12, a control current may overshoot or undershoot, for example, at the moment of switching the frequency (refer to portions RT1 and RT2 in FIG. 12). Therefore, it is required to stabilize a mean current of the control current even if the frequency of the PWM pulse is spread. In order to stabilize the mean current, a method of setting the frequency to an intermediate frequency as disclosed in Patent Literature 1 can be used. However, because a long period of time is required to stabilize the current, which is not desired.

An example of related art includes JP-A-2010-061481 (Patent Literature 1)

SUMMARY

It is an object of the present disclosure to provide a drive control device of an inductive load which suppresses the overshoot and undershoot of a mean current flowing in the inductive load in a short period of time even at the time of spreading and switching the frequency of a PWM pulse.

According to an aspect of the present disclosure, a drive control device includes: an input unit that receives a frequency command value switched to spread a frequency of a PWM pulse; and a control unit. When the frequency command value input to the input unit is a first command value, the control unit sets a period, in which a current in an inductive load is controlled to rise according to the PWM pulse, to be a first period of the PWM pulse. When the frequency command value input to the input unit is the first command value, the control unit sets a period, in which the current in the inductive load is controlled to fall according to the PWM pulse, to be a second period of the PWM pulse. When the frequency command value input to the input unit is a second command value different from the first command value, the control unit sets a period, in which the current in the inductive load is controlled to rise according to the PWM pulse, to be a third period of the PWM pulse. The third period is different from the first period. When the frequency command value input to the input unit is the second command value, the control unit sets a period, in which the current in the inductive load is controlled to fall according to the PWM pulse, to be a fourth period of the PWM pulse. The fourth period is different from the second period. When the frequency command value input to the input unit is changed from the first command value to the second command value, and at least one of middle PWM pulses is disposed between a forward PWM pulse corresponding to the first command value and an after PWM pulse corresponding to the second command value, the control unit sets a fifth period in the at least one of middle PWM pulses corresponding to the first period of the forward PWM pulse to have a length between the first period in the forward PWM pulse and the third period in the after PWM pulse or the length equal to the first period and different from the third period. When the frequency command value input to the input unit is changed from the first command value to the second command value, and the at least one of middle PMW pulses is disposed between the forward PWM pulse corresponding to the first command value and the after PWM pulse corresponding to the second command value, the control unit sets a sixth period in the at least one of middle PWM pulses corresponding to the second period of the forward PWM pulse to have a length between the fourth period in the after PWM pulse and the second period in the forward PWM pulse or the length equal to the fourth period and different from the second period. The control unit controls a flowing current in the inductive load according to the PWM pulse.

According to an aspect of the present disclosure, an input unit receives a frequency command value switched to spread a frequency of a PWM pulse. In this situation, a control unit can improve quietness because the control unit spreads the frequency of the PWM pulse to drive an inductive load.

In this example, when a frequency command value input to an input unit is a first command value, a period in which a current in an inductive load is controlled to rise by a PWM pulse is set as a first period of the PWM pulse, and a period in which the current in the inductive load is controlled to fall is set as a second period of the PWM pulse. When the frequency command value input to the input unit is a second command value different from the first command value, a period in which the current in the inductive load is controlled to rise by the PWM pulse is set as a third period of the PWM pulse, and a period in which the current in the inductive load is controlled to fall is set as a fourth period of the PWM pulse. In this situation, a control unit sets a fifth period of middle PWM pulses corresponding to the first period of forward PWM pulses to a length between the first period of the forward PWM pulses and the third period of after PWM pulses (including the first period but no third period), and sets a sixth period of the middle PWM pulses corresponding to the second period of the forward PWM pulses to a length between the fourth period of after PWM pulses and the second period of the forward PWM pulses (including the fourth period but no second period), in at least one or more middle PWM pulses between the forward PWM pulses corresponding to the first command value and the after PWM pulses corresponding to the second command value when the frequency command value input to the input unit is changed from the first command value to the second command value.

As a result, with the provision of at least one or more middle PWM pulses set to an intermediate length between the forward PWM pulses at the time of the first command value and the after PWM pulses at the time of the second command value, the mean current can be smoothly changed while a rapid change in the mean current is suppressed, and the overshoot or undershoot of the mean current flowing in the inductive load can be suppressed as much as possible.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
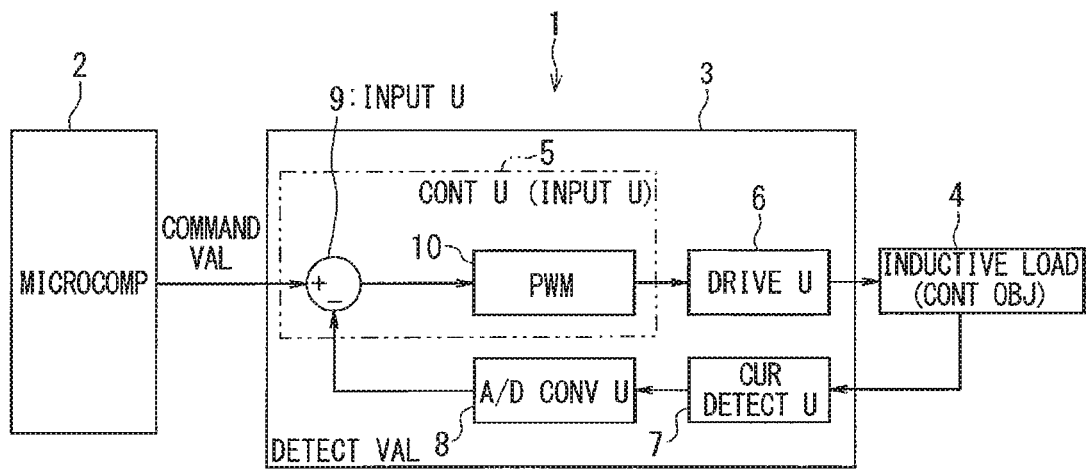
FIG. 1 is a block diagram schematically illustrating an electric configuration example according to a first embodiment.

Hereinafter, several embodiments of the present disclosure will be described with reference to the accompanying drawings. The identical or similar configurations in the respective embodiments are denoted by the same or similar reference numerals, and their description will be omitted as occasion demands in second and subsequent embodiments, and characteristic portions will be mainly described in the second and subsequent embodiments.

First Embodiment

Hereinafter, a first embodiment will be described with reference to FIGS. 1 to 4. FIG. 1 is a block diagram schematically illustrating an electric configuration of a drive control system 1.

As illustrated in FIG. 1, the drive control system 1 includes a microcomputer 2 and a drive control device 3, and drives an inductive load 4 to be controlled. The external microcomputer 2 includes a CPU, a ROM, a RAM, and an I/O (none shown), and outputs a command value to the drive control device 3. The command value is a target current command value (Target Current), or a frequency command value (FReQuency). The drive control device 3 includes a PWM control unit (corresponding to an input unit and a control unit) 5, a drive unit 6, a current detection unit 7, and an A/D conversion unit 8. The drive control device 3 subjects the inductive load 4 to be controlled to feedback current control with the use of those respective blocks.

The PWM control unit 5 is a block for generating the PWM pulse according to the command value supplied from the microcomputer 2, and functionally includes a feedback block (corresponding to the input unit) 9 that feeds back a difference between a detection value and a command value, and a PWM signal generation block 10 that generates the PWM pulse according to an output signal of the feedback block 9.

Figure 2A:
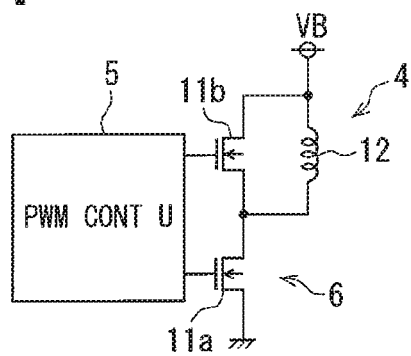
FIGS. 2A and 2B are diagrams illustrating a configuration example of a drive unit and an inductive load.
Figure 2B:
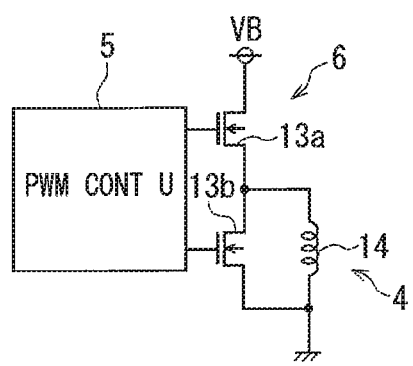

The PWM control unit 5 outputs the PWM pulse generated by the PWM signal generation block 10 to the drive unit 6. The drive unit 6 drives the inductive load 4 according to the PWM pulse input from the PWM control unit 5. Configurations and connection modes of the drive unit 6 and the inductive load 4 are not particularly limited, but the drive unit 6 and the inductive load 4 may be configured, for example, as illustrated in FIG. 2A or 2B. In an example illustrated in FIG. 2A, the drive unit 6 is configured in a low side by, for example, an n-channel type MOS transistor 11a, and the inductive load 4 is configured in a high side by a solenoid coil 12. The coil 12 is connected in parallel to an n-channel type MOS transistor 11b for synchronous flow regulation. The transistors 11a and 11b may be each formed of a p-channel type MOS transistor, or the transistor 11b may be replaced with a reflux diode. In the example illustrated in FIG. 2A, a drain-source of the MOS transistor ha and the coil 12 are connected in series between a supply terminal VB and a ground, and the PWM control unit 5 outputs a control signal to gates of the MOS transistors 11a and 11b. In a configuration illustrated in FIG. 2B, the PWM control unit 5 turns on the MOS transistor 11a and controls to turn off the MOS transistor 11b to energize the coil 12. The PWM control unit 5 also controls to turn on the MOS transistor 11b while controlling to turn off the MOS transistor 11a, to perform synchronous flow regulation. With the above configuration, when the PWM control unit 5 outputs the PWM pulse as the control signal to the gate of the MOS transistor 11a, a current flows in the inductive load 4 with a delayed phase relative to an applied voltage of a rectangular wave.

FIG. 2B illustrates another example. In an example illustrated in FIG. 2B, the drive unit 6 is configured in a high side by, for example, an n-channel type MOS transistor 13a, and a solenoid coil 14 is configured in a low side. In this situation, the coil 14 is connected in parallel to, for example, an n-channel type MOS transistor 13b for synchronous flow regulation. The transistors 13a may be formed of a p-channel type MOS transistor, or the transistor 13b may be replaced with a reflux diode. In the example illustrated in FIG. 2B, a drain-source of the MOS transistor 13a and the coil 14 are connected in series between the supply terminal VB and the ground, and the PWM control unit 5 outputs the control signal to gates of the MOS transistors 13a and 13b. In a configuration illustrated in FIG. 2B, the PWM control unit 5 turns on the MOS transistor 13a and controls to turn off the MOS transistor 13b to energize the coil 14. The PWM control unit 5 also controls to turn on the MOS transistor 13b while controlling to turn off the MOS transistor 13a, to perform synchronous flow regulation. In addition, a transistor of another type such as a bipolar junction transistor or an IGBT may be employed (nothing shown).

As illustrated in FIG. 2A, in the case where the inductive load 4 is connected to the power supply VB side, when the PWM pulse of the PWM control unit 5 is in an "H" period, a current rise control is performed. On the contrary, when the PWM pulse of the PWM control unit 5 is in an "L" period, a current fall control is performed. Conversely, as illustrated in FIG. 2B, in the case where the inductive load 4 is connected to the ground side, when the PWM pulse of the PWM control unit 5 is in the "H" period, a current fall control is performed. On the contrary, when the PWM pulse of the PWM control unit 5 is in the "L" period, the current rise control is performed.

The current detection unit 7 detects a current flowing in the inductive load 4. The current has a value determined by a time constant caused by an inductor component and an internal resistance component of the inductive load 4, and an on-resistance component of the MOS transistor 11a or 13a configuring the drive unit 6. The current detection unit 7 can be also variously configured. For example, the inductive load 4 may be connected in series with a resistor (not illustrated), and a voltage to be applied to the resistor may be detected. The A/D conversion unit 8 subjects a detection result of the current detection unit 7 to A/D conversion to obtain a detection value of a digital signal, and outputs the detection value to the feedback block 9 of the PWM control unit 5. The PWM control unit 5 generates the PWM pulse according to the detection value together with the command value input from the microcomputer 2, and outputs the PWM pulse to the drive unit 6. The operation is repeated.

Figure 3:
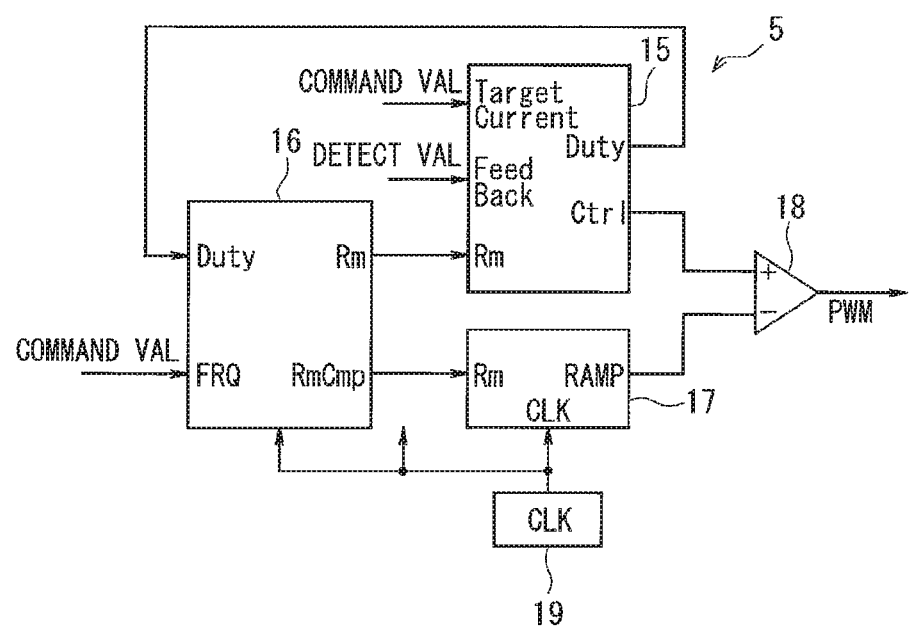
FIG. 3 is a block diagram schematically illustrating an electric configuration example of a PWM control unit.

Hereinafter, a configuration example of the PWM control unit 5 will be described with reference to FIG. 3. As illustrated in FIG. 3, the PWM control unit 5 includes a reference value generation block 15, a limit count value setting block (corresponding to a counter limit change unit) 16, a RAMP wave generation block (corresponding to a measurement unit) 17, and a comparison block 18. Among those components, the reference value generation block 15, the limit count value setting block 16, and the RAMP wave generation block 17 operate upon receiving a clock signal CLK from a clock generation unit 19. A generation cycle of the clock signal CLK is set to be shorter than a diffusion cycle of the frequency spread, for example, by several times or higher, and various kinds of signal processing are enabled at a fine timing.

The RAMP wave generation block 17 includes, for example, a counter. The comparison block 18 is configured by, for example, a comparator. In the PWM pulse, a control value Ctrl output by the reference value generation block 15 is compared with a triangular wave signal output by the RAMP wave generation block 17, and whether an output level of the PWM pulse is "H" or "L" is determined according to a magnitude of the control value and the triangular wave signal. A period ratio in the magnitude of the control value Ctrl and the triangular wave signal is related to a duty ratio of the PWM pulse.

The reference value generation block 15 receives a current command value, an output detection value of the A/D conversion unit 8, and the limit count value Rm, calculates a mean current of an energization current of the inductive load 4 on the basis of the output detection value from the A/D conversion unit 8, and outputs a duty ratio Duty of a subsequent pulse and the control value Ctrl on the basis of those results. The reference value generation block 15 outputs the duty ratio Duty of the subsequent pulse to the limit count value setting block 16, and outputs the control value Ctrl to the comparison block 18 (for example, a non-inverting input terminal of the comparator). The output timing is set to, for example, a timing corresponding to a start timing of the subsequent PWM pulse in advance.

The limit count value setting block 16 receives the duty ratio Duty of the subsequent pulse output by the reference value generation block 15 and the frequency command value output by the microcomputer 2. The limit count value setting block 16 sets a limit count value of the subsequent pulse as Rm, and outputs the limit count value as a limit count value Rm of the reference value generation block 15, and sets the limit count value of a previous PWM pulse as RmCmp, and outputs the limit count value as a peak value (limit count value Rm of a built-in counter) of a triangular signal generated by the RAMP wave generation block 17.

Upon receiving the peak value (limit count value Rm of the built-in counter), the RAMP wave generation block 17 counts the clock signal CLK from the clock generation unit 19, and outputs the triangular signal changed with a change in the count value to the comparison block 18 (for example, an inverting input terminal of the comparator). The comparison block 18 compares the triangular signal output by the RAMP wave generation block 17 with the control value Ctrl output by the reference value generation block 15, and outputs a comparison result to the drive unit 6 as the PWM pulse. The PWM control unit 5 is configured as described above.

The operation of the above configuration will be described. The microcomputer 2 outputs a frequency command value that has been subjected to frequency spread by, for example, a pseudo random code to the drive control device 3. The frequency spreading process can be applied with a general one. The frequency command value is a command value having a level of ±several kHz relative to a center value of, for example, about several kHz.

Figure 4:
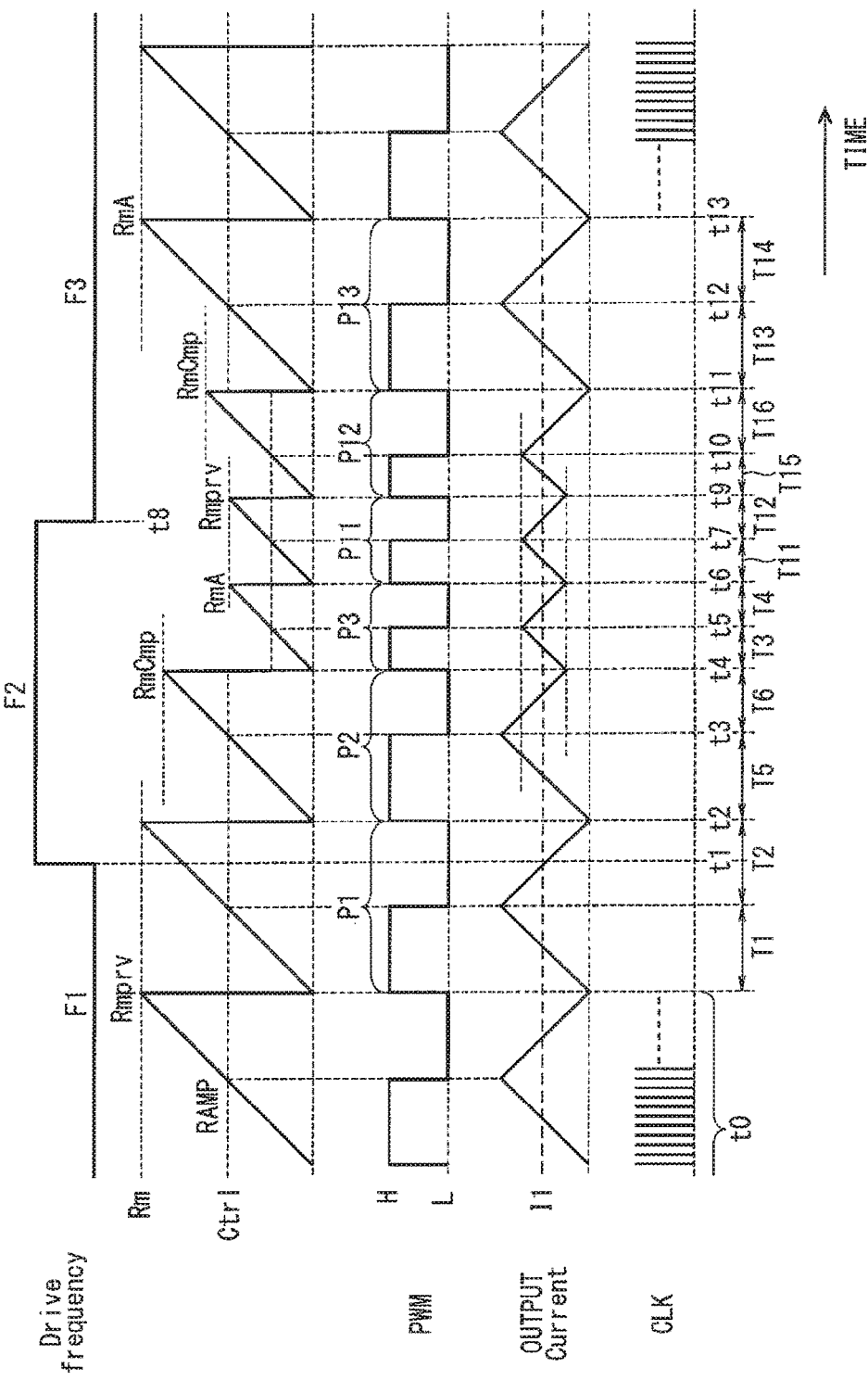
FIG. 4 is a timing chart schematically illustrating the operation.

FIG. 4 is a timing chart schematically illustrating a signal change of each node. For convenience of description, assuming that the frequency command value of the PWM pulse is set to F1, and a current corresponding to the PWM pulse of the frequency command value F1 steadily flows in the inductive load 4, a description will be given. The drive control device 3 inputs the frequency command value to the PWM control unit 5. The PWM control unit 5 continuously sets the limit count value Rm corresponding to the frequency command value. Then, the RAMP wave generation block 17 counts, for example, the clock signals CLK from an initial value (for example, 0) to the limit count value Rm, and outputs a signal voltage corresponding to a count value to the comparison block 18.

When the control value Ctrl controlled for each of the PWM pulses is higher than a voltage of an output triangular wave signal from the RAMP wave generation block 17, the PWM control unit 5 outputs "H" as the PWM pulse. For example, in the case where the drive unit 6 is configured as illustrated in FIG. 2A, upon receiving "H", the drive unit 6 controls the energization of the inductive load 4. As a result, an energization current of the inductive load 4 rises with the result that a current flowing in the inductive load 4 can be controlled to rise. When the voltage of the output triangular wave signal from the RAMP wave generation block 17 becomes higher than the control value Ctrl, the PWM control unit 5 outputs "L" as the PWM pulse. Upon receiving the "L", the drive unit 6 reduces the energization of the inductive load 4. The inductive load 4 allows the current to continuously flow, but gradually reduces the current. As a result, the current flowing in the inductive load 4 can be controlled to fall. The fall control process is terminated when the RAMP wave generation block 17 counts the clock signals up to the limit count value Rm.

Upon counting the clock signals CLK up to the limit count value Rm, the RAMP wave generation block 17 clears the counter value, returns to the initial value (for example, 0), and again starts to count the clock signal CLK. The operation is repeated. With the above operation, unless the frequency command value and the command value of the duty ratio are changed, the RAMP wave generation block 17 can output a PWM pulse having a fixed frequency and a fixed duty.

The reference value generation block 15 receives a target current value and a current detection value, and outputs the duty command value Duty and the control value Ctrl so that those values are identical with each other as much as possible. In this situation, the reference value generation block 15 outputs the duty command value Duty calculated on the basis of the target current value and the current detection value. The reference value generation block 15 controls a mean current I1 flowing in the inductive load 4 to be kept constant in the duty command value Duty, and controls the mean current I1 to be kept constant even when a variation or a temperature characteristic of the inductive load 4 per se, or the power supply VB to be supplied to the inductive load 4 is varied.

For example, because a large amount of current flows when the target current value is higher than the current detection value, the reference value generation block 15 increases the duty command value Duty, and also increases the control value Ctrl. If the reference value generation block 15 increases the duty command value Duty, the limit count value setting block 16 can set the limit count value Rm to be higher, and can set the control value Ctrl to be higher. Conversely, because a small amount of current flows when the target current value is lower than the current detection value, the reference value generation block 15 decreases the duty command value Duty, and also decreases the control value Ctrl. If the reference value generation block 15 decreases the duty ratio Duty, the limit count value setting block 16 can set the limit count value Rm to be lower. As a result, the limit count value setting block 16 can set the subsequent control value Ctrl to be lower.

When the frequency command value is not changed even if the duty ratio Duty is changed, the limit count value setting block 16 does not change the limit count value RmCmp of the RAMP wave generation block 17. Therefore, the limit count value setting block 16 and the reference value generation block 15 can change the control value Ctrl without any change in the limit count value RmCmp of the RAMP wave generation block 17 (corresponding to the frequency command value). Accordingly, the PWM control unit 5 can adjust the duty ratio ("H" period/"L" period) of the PWM pulse while keeping a constant frequency of the PWM pulse (before t0 in FIG. 4). In that case, the PWM pulse steadily output in the first command value F1 is defined as "forward PWM pulse P1". In this example, when it is assumed that there is no influence of a variation in the current detection value or a disturbance (temperature variation, etc.), an "H" period (first period T1) and an "L" period (second period T2) of the forward PWM pulse P1 become the same period for at least two or more (for example, several) consecutive pulses while the first command value F1 of the frequency is kept constant.

When the frequency command value is changed from the first command value F1 to a second command value F2, the limit count value setting block 16 receives the second command value F2 (t1 in FIG. 4), and changes the value RmCmp.

In this situation, the limit count value setting block 16 sets the limit count value during the steady operation by the first command value F1 as a previous limit count value Rmprv, a current limit count value as RmCmp, and a limit count value derived in advance when it is assumed that the steady operation is performed by the second command value F2 as RmA. The limit count value setting block outputs the value RmCmp on the basis of the following Expression (1). In the present specification, "steady operation" indicates an operation period having a fixed frequency in a state where the frequency command value is changed at random according to a frequency spread process.

$$RmCmp = Rmprv + \{(1-\text{Duty}) \times (RmA - Rmprv)\}/2 \quad (1)$$

In a first routine after the frequency command value is changed, because a previous value Rmprv is not changed from a value of the last but one, even if the limit count value setting block outputs a value Rm to a reference value setting block, the reference value setting block receives the value Rm as an input value Rm. However, if it is assumed that both of the current command value and the current detection value are not changed, and an influence of the disturbance such as a temperature dependency of the voltage is negligible, because the value Rm is not changed, the reference value generation block 15 does not change the control value Ctrl in this case (refer to t2 to t3 in a fifth period in FIG. 4).

On the other hand, the value RmCmp becomes lower because the second command value F2 (for example, 5 kHz) becomes higher than the first command value F1 (for example, 10 kHz). The RAMP wave generation block 17 counts the clock signal CLK with the value RmCmp as an upper limit value of the count, and generates the triangular wave signal to output the generated signal to the comparison block 18 (refer to t2 to t3 in the fifth period T5 in FIG. 4). In this situation, the value RmCmp is set to be lower than the value Rmprv. When it is assumed that the PWM pulse at that time is a middle PWM pulse P2, the middle PWM pulse P2 becomes higher in the frequency and becomes higher in the duty ratio as compared with the forward PWM pulse P1 (refer to t2 to t4 in a period of the fifth period T5+a sixth period T6 in FIG. 4). An upper limit value of the output current is not changed from the upper limit value based on the forward PWM pulse P1, but a lower limit value of the output current becomes higher than the lower limit value based on the forward PWM pulse P1. With an elapsed time, the RAMP wave generation block 17 clears the counter (t4 in FIG. 4).

In a second routine after the frequency command value is changed to the second command value F2, because the value Rm is changed to the value RmCmp, when the limit count value setting block 16 outputs the value Rm to the reference value generation block 15, the reference value generation block 15 changes the control value Ctrl on the basis of the value Rm (refer to t4 to t6 in the control value Ctrl in a third period T3 and a fourth period T4 of FIG. 4).

With the above operation, the limit count value setting block 16 changes the value RmCmp on the basis of the above Expression (1). For that reason, the RAMP wave generation block 17 receives a value RmA illustrated in FIG. 4 as the limit count value Rm. The RAMP wave generation block 17 counts the clock signal with the value RmA as a limit (t4 to t6 in the third period T3+the fourth period T4 of FIG. 4). When it is assumed that the PWM pulse at that time is an after PWM pulse P3, the after PWM pulse P3 becomes higher in the frequency and becomes lower in the duty ratio as compared with the middle PWM pulse P2 (refer to t4 to t6 in the third period T3+the fourth period T4 in FIG. 4). Then, the lower limit value of the output current is not changed from the lower limit value based on the middle PWM pulse P2, but the upper limit value of the output current becomes lower than the upper limit value based on the middle PWM pulse P2. In other words, because the limit count value is set to the value RmCmp, a rising degree of the output current can be reduced as compared with the conventional art. With an elapsed time, the RAMP wave generation block 17 clears the counter (t6 in FIG. 4).

As a result, when the second command value F2 becomes higher than the first command value F1, the PWM control unit 5 can set the frequency to an intermediate value in the middle PWM pulse P2 between the forward PWM pulse P1 steadily output according to the first command value F1 before switching the frequency, and the after PWM pulse P3 steadily output according to the second command value F2 after switching the frequency.

In the above description, a first half period of the forward PWM pulse P1 is set to the first period T1, and a second half period of the forward PWM pulse P1 is set to the second period T2, a first half period of the after PWM pulse P3 is set to the third period T3 and a second half period of the after PWM pulse P3 is set to the fourth period T4, and a first half period of the middle PWM pulse P2 is set to the fifth period T5, and a second half period of the middle PWM pulse P2 is set to the sixth period T6. A relationship of those periods can be represented by T1=T5>T3, T2>T6>T4.

Figure 12:
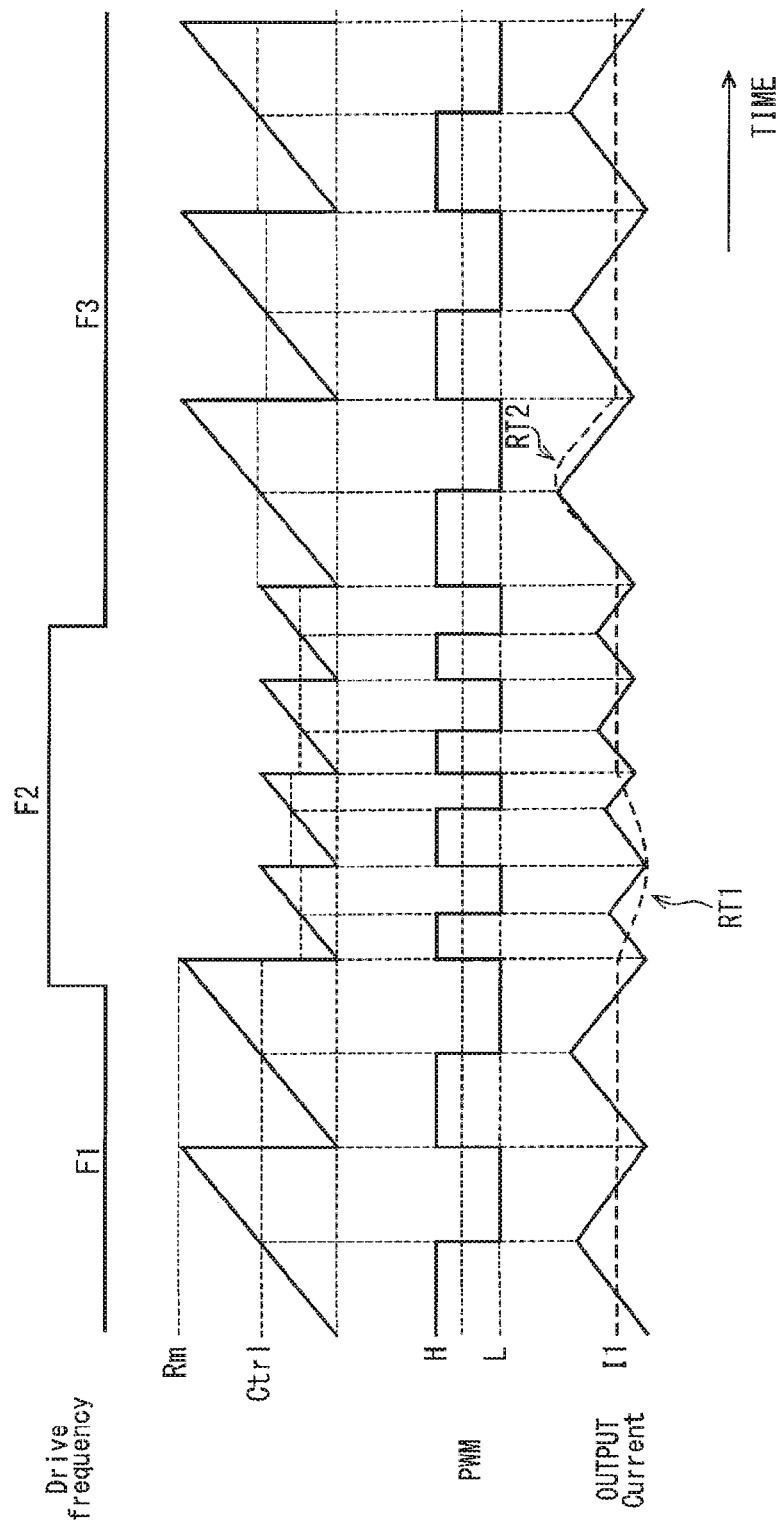
FIG. 12 is a timing chart schematically illustrating an example in which a mean current overshoots or undershoots in a comparative example.

Even if the frequency of the frequency command value is largely changed according to a frequency spreading process, because the above-mentioned relationship of the first period T1 to the sixth period 16 is set to be satisfied, the mean current I1 of the output current can be prevented from being overshot or undershot (refer to comparison of the mean current I1 of the output current indicated by RT1 in FIG. 12 with the mean current I1 of the output current illustrated in FIG. 4). When it is assumed that there is no influence of a variation in the current detection value or a disturbance (temperature variation, etc.), an "H" period (third period 13) and an "L" period (fourth period T4) of the after PWM pulse P3 become the same period for at least two or more (for example, several) consecutive pulses while the second command value F2 of the frequency is kept constant.

The same operation is also obtained when the frequency rises. The PWM pulse when the frequency command value is steadily output in the second command value F2 is defined as "forward PWM pulse P11" (refer to a first period T11 and a second period T12 in FIG. 4). When the frequency command value is changed from the second command value F2 to a third command value F3 (<F2), the limit count value setting block 16 receives the third command value F3 (t8 in FIG. 4), and changes the subsequent value RmCmp.

In this situation, the limit count value setting block 16 sets the limit count value during the steady operation by the second command value F2 as a previous limit count value Rmprv, a current limit count value as RmCmp, and a limit count value derived in advance when it is assumed that the steady operation is performed by the third command value F3 at that timing as RmA. The limit count value setting block 16 outputs the value RmCmp on the basis of the above Expression (1).

In a first routine after the frequency command value is changed to a third command value F3, the previous value Rmprv is not changed from the value of the last but one. For that reason, even if the limit count value setting block 16 outputs the limit count value Rm to the reference value generation block 15, the reference value generation block 15 does not change the control value Ctrl (refer to t9 to t10 in a fifth period T15 of FIG. 4).

When the third command value F3 (for example, 5 kHz) becomes lower than the second command value F2 (for example, 10 kHz), the value RmCmp becomes higher. The RAMP wave generation block 17 counts the clock signal CLK with the value RmCmp as an upper limit value of the counter, and generates the triangular wave signal to output the generated signal to the comparison block 18 (refer to t9 to t11 in the fifth period T15+a sixth period T16 in FIG. 4).

When it is assumed that the PWM pulse at that time is set as a middle PWM pulse P12, the middle PWM pulse P12 becomes lower in the frequency than a forward PWM pulse P11. The duty ratio also becomes lower (t9 to t11 in the fifth period T5+the sixth period T16 in FIG. 4). An upper limit value of the output current is not changed from the upper limit value based on the forward PWM pulse P11, but a lower limit value of the output current becomes lower than the lower limit value based on the forward PWM pulse P11. In this situation, because the limit count value is set to the value RmCmp, a falling degree of the output current can be reduced. With an elapsed time, the RAMP wave generation block 17 clears the counter (t11 in FIG. 4).

As a result, when the third command value F3 becomes lower than the second command value F2, the PWM control unit 5 can set, to the intermediate value, the frequency of the middle PWM pulse P12 between the forward PWM pulse P11 steadily output according to the second command value F2 before switching the frequency, and the after PWM pulse P13 steadily output according to the third command value F3 after switching the frequency. In the above description, a first half period of the forward PWM pulse P11 is set to the first period 111, and a second half period of the forward PWM pulse P11 is set to the second period T12, a first half period of the after PWM pulse P13 is set to the third period T13 and a second half period of the after PWM pulse P13 is set to the fourth period T14, and a first half period of the middle PWM pulse P12 is set to the fifth period T15, and a second half period of the middle PWM pulse P12 is set to the sixth period T16. A relationship of those periods can be represented by T11=T15<T13, T12<T16<T14.

As described above, according to the present embodiment, because the first period T1 or T11 to the sixth period T6 or T16 of the above-mentioned respective PWM pulses P1 . . . P3, P11 . . . P13 are set to satisfy the above-mentioned relationship, the mean current I1 of the output current can be prevented from being overshot or undershot. Since the middle PWM pulses P2 and P12 are configured by one PWM pulse, a control process can be simplified.

In the present embodiment, the first periods T1 and T11 are set to be identical with the third periods T3 and T13, and the control value Ctrl in the middle PWM pulses P2 and P12 is set to be identical with the control value Ctrl in the forward PWM pulses P1 and P11. As a result, a current peak value when the inductive load 4 is driven by the middle PWM pulse P2 can be set to be identical with a current peak value when the inductive load 4 is driven by the forward PWM pulse P1. Likewise, a current peak value when the inductive load 4 is driven by the middle PWM pulse P12 can be set to be identical with a current peak value when the inductive load 4 is driven by the forward PWM pulse P11. As a result, even if the frequency command values are diffused, the mean current can be kept constant as much as possible.

The current upper limit values are uniformed when the inductive load 4 is driven by the middle PWM pulses P2 and P12. However, the present embodiment is not limited thereto, but current lower limit values may be uniformed when the inductive load 4 is driven by the middle PWM pulses P2 and P12.

Second Embodiment

Figure 5:
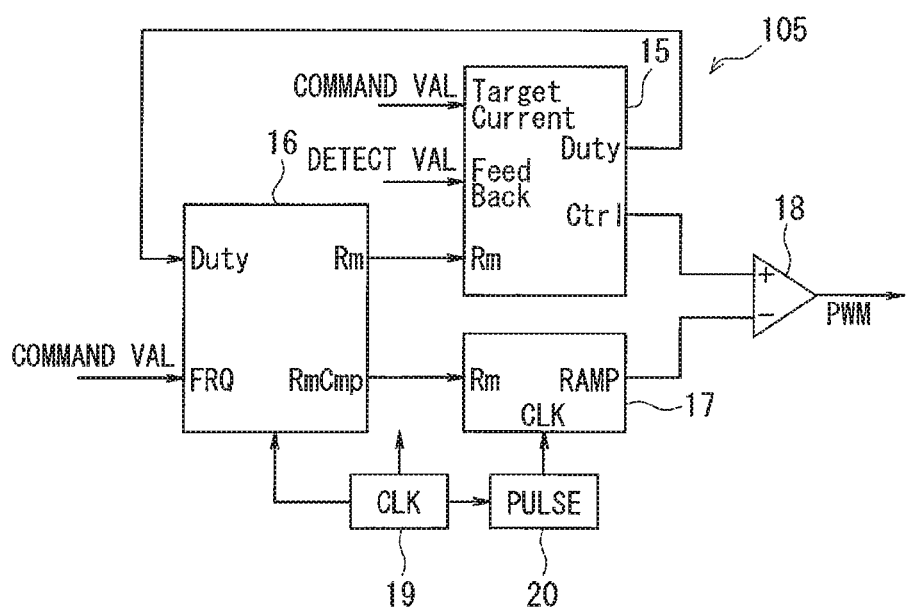
FIG. 5 is a block diagram schematically illustrating an electric configuration example of a PWM control unit according to a second embodiment.
Figure 6:
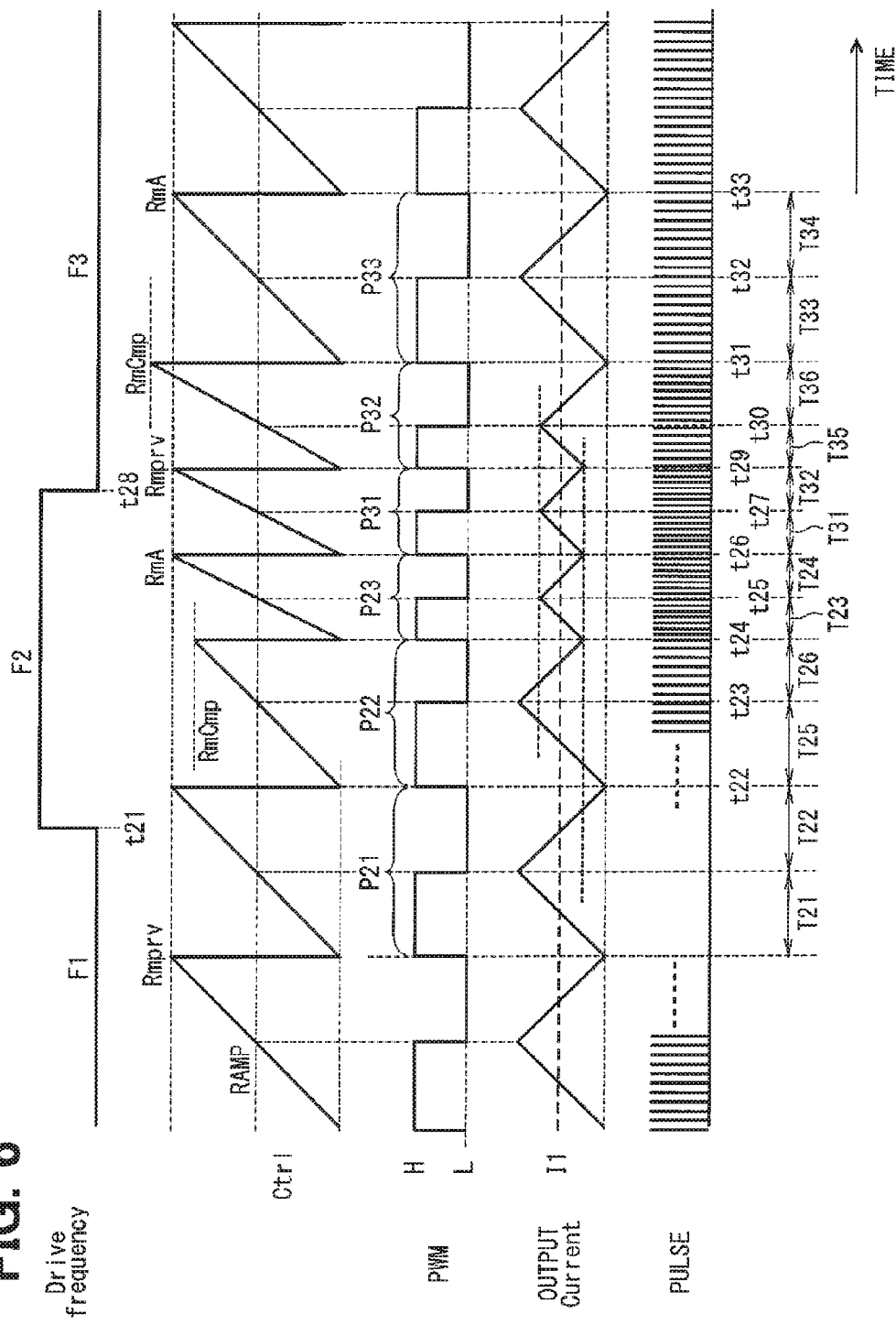
FIG. 6 is a timing chart schematically illustrating the operation.

FIGS. 5 and 6 illustrate additional illustrative views of a second embodiment. A configuration example of a PWM control unit 105 provided in the drive control device 3 instead of the PWM control unit 5 is illustrated in FIG. 5. As in the PWM control unit 5, the PWM control unit 105 includes a reference value generation block 15, a limit count value setting block 16, a RAMP wave generation block 17, and a comparison block 18, and operates according to a clock signal CLK from a clock generation unit 19. In addition, the clock generation unit 19 is connected with a pulse generation unit 20. The pulse generation unit 20 divides or multiplies the clock signal CLK generated by the clock generation unit 19, for example, according to a control of a limit count value setting block (corresponding to a count frequency control unit) 16, and outputs the clock signal CLK to a clock input terminal of the RAMP wave generation block 17.

The pulse generation unit 20 changes a frequency of the clock signal CLK according to a frequency command value, and outputs the changed frequency to the RAMP wave generation block 17. The RAMP wave generation block 17 counts an output pulse (PULSE) from the pulse generation unit 20, and generates a triangular wave signal. Therefore, if the frequency of the output pulse of the pulse generation unit 20 is higher, a rising slope of the triangular wave signal becomes higher, and if the frequency of the output pulse is lower, a rising slope of the triangular wave signal becomes lower.

The operation of the above configuration will be described. First, the PWM pulse steadily output at a frequency F1 is defined as the forward PWM pulse P1. When the frequency command value is changed from the first command value F1 to the second command value F2, the limit count value setting block 16 receives the second command value F2 (t21 in FIG. 6), and changes the value RmCmp.

In this situation, when the limit count value setting block 16 sets the limit count value during the steady operation by the first command value F1 as a previous limit count value Rmprv, and a current limit count value as RmCmp, the limit count value setting block 16 outputs the value RmCmp so as to satisfy value Rmprv>value RmCmp.

In this situation, even if the frequency command value is changed (F1 to F2), the reference value generation block 15 does not change the control value Ctrl. Therefore, a first half period of a forward PWM pulse P21 can be set to be identical with a first half period of a middle PWM pulse P22 (a first period T21=a fifth period T25 in FIG. 6). As a result, a current upper limit value when the inductive load 4 is driven by the middle PWM pulse P22 can be set to be identical with a current upper limit value when the inductive load 4 is driven by the forward PWM pulse P21. Because the RAMP wave generation block 17 counts the output pulse with the value RmCmp set by the limit count value setting block 16 as an upper limit value, the RAMP wave generation block 17 can increase the duty ratio while increasing the frequency of the middle PWM pulse P22 (lower than F2).

Thereafter, for example, the limit count value setting block 16 controls a change in the frequency of an output pulse signal from the pulse generation unit 20 according to a change in the frequency command value. The pulse generation unit 20 that functions as a count frequency change unit adjusts a multiplication factor of the clock signal CLK according to the second command value F2, and changes and adjusts the frequency of the pulse signal output by the pulse generation unit 20. On the other hand, the limit count value setting block 16 reduces the limit count value RmCmp in the first routine, and returns the limit count value RmCmp to the same value as that in the first command value F1 in the second routine (t24 to t26 in a third period T23 and a fourth period T24 of FIG. 6). Then, because the RAMP wave generation block 17 counts the pulse signal, the RAMP wave generation block 17 can output the after PWM pulse P23 high in the frequency. As a result, the frequency can be adjusted and steadily output without any change in the duty ratio.

The same operation is also obtained when the frequency rises. The PWM pulse when the frequency command value is in a steady state in the second command value F2 is defined as "forward PWM pulse P31" (refer to a first period T31 and a second period T32 in FIG. 6). When the frequency command value is changed from the second command value F2 to a third command value F3 (<F2), the limit count value setting block 16 receives the third command value F3 (t28 in FIG. 6), and changes the value RmCmp set thereafter.

In this situation, when the limit count value setting block 16 sets the limit count value during the steady operation by the second command value F2 as a previous limit count value Rmprv, and a current limit count value as RmCmp, the limit count value setting block 16 outputs the value RmCmp so as to satisfy value Rmprv<value RmCmp.

In this situation, even if the frequency command value is changed, the reference value generation block 15 does not change the control value Ctrl. Therefore, a first half period of a forward PWM pulse P31 can be set to be identical with a first half period of a middle PWM pulse P32 (a first period T31=a fifth period T35 in FIG. 6). As a result, a current upper limit value when the inductive load 4 is driven by the middle PWM pulse P32 can be set to be identical with a current upper limit value when the inductive load 4 is driven by the forward PWM pulse P31. Because the RAMP wave generation block 17 counts the output pulse with the value RmCmp set by the limit count value setting block 16 as an upper limit value, the RAMP wave generation block 17 can increase the duty ratio while increasing the frequency of the middle PWM pulse P32.

Thereafter, the limit count value setting block 16 controls a change in the frequency of an output pulse signal from the pulse generation unit 20 according to the frequency command value. In this situation, the limit count value setting block 16 adjusts a multiplication factor of the clock signal CLK according to the third command value F3, and adjusts the frequency of the pulse signal output by the pulse generation unit 20. On the other hand, the limit count value setting block 16 changes the limit count value RmCmp in the first routine, and returns the limit count value RmA to the same value as the value Rmprv in the first command value F1 in the second routine (a third period T33 and a fourth period T34 of FIG. 6). Then, because the RAMP wave generation block 17 counts the pulse signal of the pulse generation unit 20 which is adjusted in the frequency, the RAMP wave generation block 17 can output the after PWM pulse P33 low in the frequency. As a result, the frequency can be adjusted and steadily output without any change in the duty ratio.

As described above, in the configuration of the present embodiment, the mean current can be held constant as much as possible without being overshot or undershot as in the above-mentioned embodiment.

Third Embodiment

Figure 7:
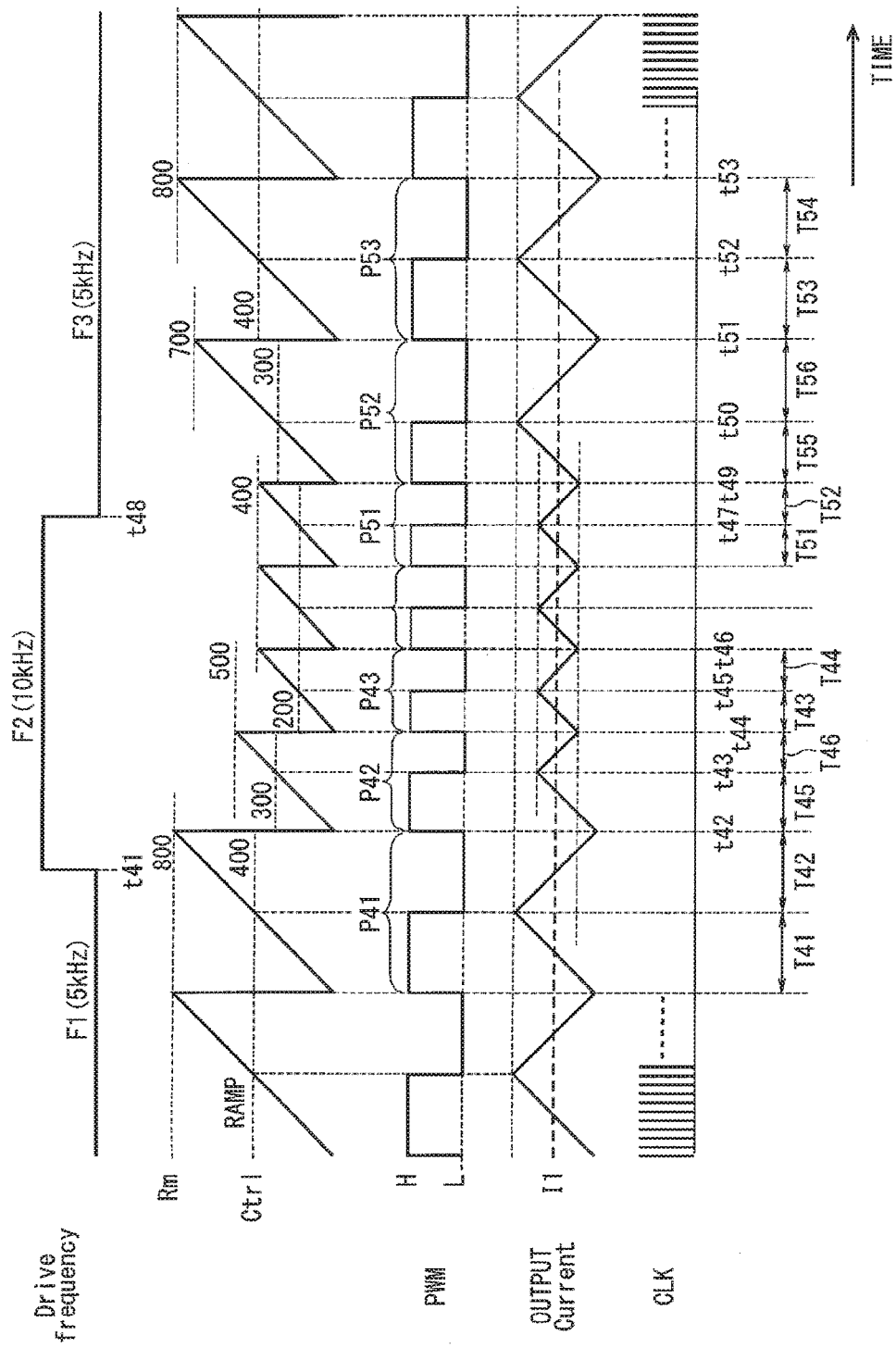
FIG. 7 is a timing chart schematically illustrating operation according to a third embodiment.

FIG. 7 illustrates an additional illustrative view of a third embodiment. The present embodiment is a modification of the first embodiment, and an electric configuration is identical with that in the first embodiment, and therefore its description will be omitted. As illustrated in a first half of FIG. 7, it is assumed that a PWM pulse in a first command value F1 is a forward PWM pulse P41, a PWM pulse in a second command value F2 is an after PWM pulse P43, and an intermediate PWM pulse between those pulses is a middle PWM pulse P42. In this case, the reference value generation block 15 sets a control value Ctrl to a value between a control value Ctrl for generating the forward PWM pulse P41 and a control value Ctrl for generating the after PWM pulse P43 when setting a fifth period T45 ("H" period) and a sixth period T46 ("L" period) of the middle PWM pulse P42. When the limit count value setting block 16 sets the limit count value during the steady operation by the first command value F1 as a previous limit count value Rmprv, a current limit count value as RmCmp, and a limit count value derived in advance when it is assumed that the steady operation is performed by the second command value F2 as RmA, the limit count value setting block 16 outputs the value RmCmp on the basis of the above-mentioned Expression (1).

As a result, the fifth period T45 (="H" period) of the middle PWM pulse P42 can be set to a length shorter than the first period T41 of the forward PWM pulse P41, and exceeding the third period T43 of the after PWM pulse P43. Moreover, the sixth period T46 (="L" period) of the middle PWM pulse P42 can be set to a length shorter than the second period T42 of the forward PWM pulse P41, and exceeding the fourth period T44 of the after PWM pulse P43. As illustrated in a second half portion of FIG. 7, because the same is applied to a case in which the frequency is allowed to rise (refer to t47 to t53, T51 to T56 in FIG. 7), its description will be omitted. The respective numeral values illustrated in FIG. 7 are an example of the count values at the respective frequencies F1 to F3.

As in the above-mentioned embodiments, in the present embodiment, the mean current I1 of the output current can be prevented from being overshot or undershot, and the mean current I1 can be kept constant as much as possible.

Fourth Embodiment

Figure 8:
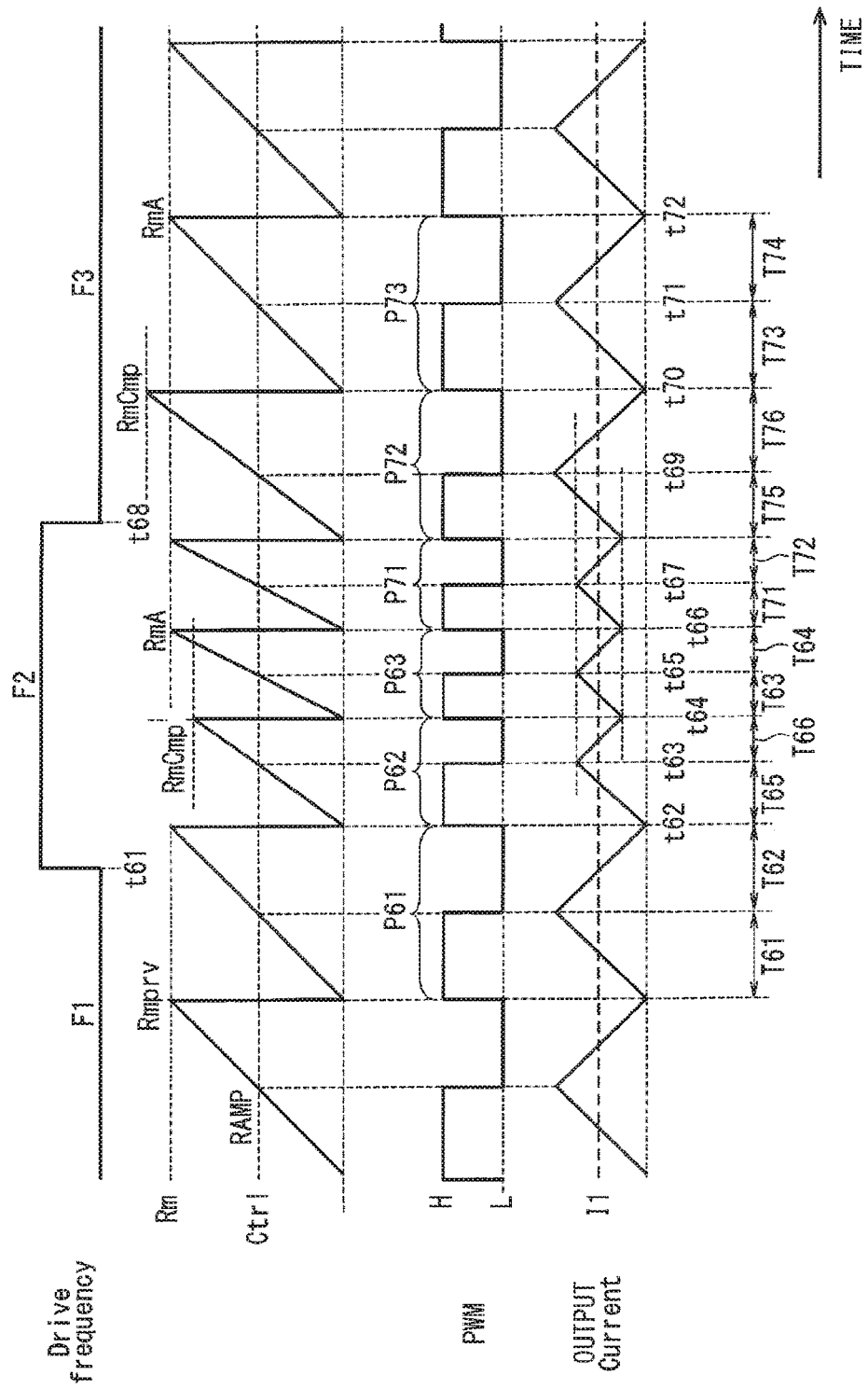
FIG. 8 is a timing chart schematically illustrating operation according to a fourth embodiment.

FIG. 8 illustrates an additional illustrative view of a fourth embodiment. The fourth embodiment is a modification of the second embodiment, and an electric configuration is identical with that in the second embodiment, and therefore its description will be omitted.

As illustrated in a first half of FIG. 8, it is assumed that a PWM pulse in a first command value F1 is a forward PWM pulse P61, a PWM pulse in a second command value F2 is an after PWM pulse P63, and an intermediate PWM pulse between those pulses is a middle PWM pulse P62. In this case, when a fifth period T65 ("H" period) and a sixth period T66 ("L" period) of the middle PWM pulse P62 are set, a limit count value setting block 16 that functions as a count frequency control unit sets a pulse frequency of the pulse generation unit 20 so as to set the fifth period T65 ("H" period) of the middle PWM pulse P62 to be shorter than a first period T61 of the forward PWM pulse P61, and longer than a third period T63 of the after PWM pulse P63. The frequency of the middle PWM pulse P62 at this time is set to a frequency between the first command value F1 and the second command value F2.

The limit count value setting block 16 sets a limit count value RmCmp so as to set a fourth period T64 of the after PWM pulse P63 to be identical with the sixth period T66 when setting the fifth period 165 ("H" period) and the sixth period T66 ("L" period) of the middle PWM pulse P62 (refer to t61 to t66 in FIG. 8). The setting is performed while changing the frequency of the output pulse signal by the pulse generation unit 20. In summary, the first period T61 to the sixth period T66 are set to satisfy T61<T65<T63, and T62<T64=T66.

As illustrated in a second half of FIG. 8, it is assumed that a PWM pulse in a second command value F2 is a forward PWM pulse P71, a PWM pulse in a third command value F3 is an after PWM pulse P73, and an intermediate PWM pulse between those pulses is a middle PWM pulse P72. In this case, when a fifth period T75 ("H" period) and a sixth period T76 ("L" period) of the middle PWM pulse P72 are set, a limit count value setting block 16 that functions as a count frequency control unit sets a pulse frequency of the pulse generation unit 20 so as to set the fifth period T75 ("H" period) of the middle PWM pulse P72 to be longer than a first period T71 of the forward PWM pulse P71, and shorter than a third period T73 of the after PWM pulse P73. The frequency of the middle PWM pulse P62 at this time is set to a frequency between the second command value F2 and the third command value F3.

The limit count value setting block 16 sets a limit count value RmCmp so as to set a fourth period T74 of the after PWM pulse P73 to be identical with the sixth period T76 when setting the fifth period T75 ("H" period) and the sixth period T76 ("L" period) of the middle PWM pulse P72 (refer to t66 to t72 in FIG. 8). The setting is performed while changing the frequency of the pulse signal by the pulse generation unit 20. In summary, the first period T71 to the sixth period T76 are set to satisfy T71<T75<T73, and T72<T74=T76.

In the present embodiment, the fourth period T64 is set to be identical with the sixth period T66. As a result, a current upper limit value when the inductive load 4 is driven by the middle PWM pulse P62 can be set to be identical with a current upper limit value when the inductive load 4 is driven by the after PWM pulse P63. Likewise, a current upper limit value when the inductive load 4 is driven by the middle PWM pulse P72 can be set to be identical with a current upper limit value when the inductive load 4 is driven by the after PWM pulse P73. As a result, as in the above-mentioned embodiments, the mean current I1 of the output current can be prevented from being overshot or undershot, and the mean current I1 can be kept constant as much as possible.

Fifth Embodiment

Figure 9:
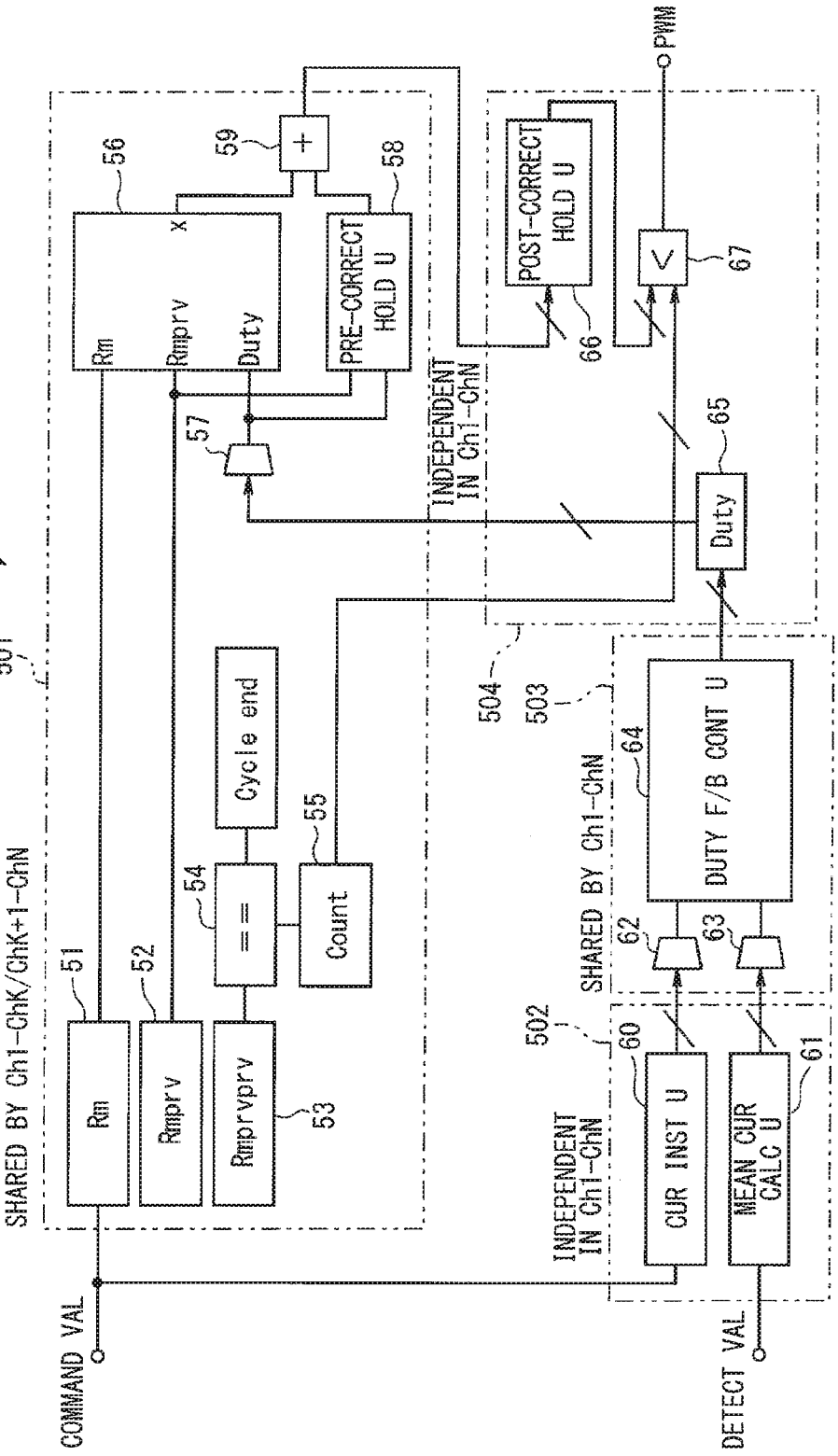
FIG. 9 is a block diagram schematically illustrating an electric configuration example of a PWM control unit according to a fifth embodiment.

FIG. 9 illustrates an additional illustrative view of a fifth embodiment. The fifth embodiment shows a configuration in which a drive control device having multiple (N) channels when driving multiple inductive loads is partially shared. For example, in a vehicle drive control device, as illustrated in FIG. 9, a PWM control unit 500 is configured to drive an inductive load 4 of, for example, N channels (Ch1 to ChN: N≥2). Blocks 501 to 504 configuring the PWM control unit 500 are divided into the blocks 502 and 504 provided, individually, and the blocks 501 and 503 that can be partially or entirely shared by channels. In particular, in the present embodiment, the PWM control unit 500 varies the same frequency while receiving the same frequency command value in channels Ch1 to ChK (1≤K≤N−1) to perform a spreading process, and is driven with the same current command value. In addition, the PWM control unit 500 varies the frequency while receiving another same frequency command value different from that in the channels Ch1 to ChK, in channels ChK+1 to ChN to perform a spreading process, and is driven. The PWM control unit 500 is driven with another same current command value different from that in the channels Ch1 to ChK. The command values in FIG. 9 correspond to frequency command values and current command values input from the microcomputer 2, and those command values are input to the blocks 501 and 502.

The block 501 is configured by connecting holding units 51 to 53, a comparison unit 54, a count unit (corresponding to a measurement unit) 55, a calculation unit (corresponding to a correction unit) 56, a selector 57, a pre-correction holding unit 58, and a calculation unit 59 to each other. Two of those components are provided in total, including one for the channels Ch1 to ChK, and the other for the channels ChK+1 to ChN. The block 501 sets and corrects a duty ratio Duty and a limit count value Rm (peak value) according to a command value input from a microcomputer 2, and outputs those values to the block 504. The holding units 51 to 53 shift and hold the limit count value Rm of the PWM pulse input currently, a limit count value Rmprv of the PWM pulse input previously, and a limit count value Rmprvpry of the PWM pulse input the last but one in order every time receiving a command value of the PWM pulse.

The count unit 55 counts the pulse of a clock signal CLK, and the comparison unit 54 compares a count value of the count unit 55 with the limit count value Rmprvprv, and terminates a cycle of the PWM pulse when those values become identical with each other (Cycle end).

The calculation unit 56 receives the limit count value Rm input currently and the limit count value Rmprv input previously, and receives the duty ratio Duty determined for each of the channels Ch1 to ChK/ChK+1 to ChN, and calculates a duty correction amount x according to the following Expression (2).

$$x = (1-\text{duty}) \times \text{duty} \times \frac{1}{2}(Rmprv - Rm) \quad (2)$$

In Expression (2), the duty represents a duty ratio by the current control.

The block 502 is a block that receives a command value from the microcomputer 2, receives a detection value of a current value flowing in the inductive load 4, and performs various arithmetic processing, and is disposed for each of the channels Ch1 to ChN, individually. A current instruction unit 60 and a mean current calculation unit 61 are disposed for each of the channels Ch1 to ChN. Upon receiving the command value from the microcomputer 2, the current instruction unit 60 outputs a current instruction signal corresponding to the command value to the block 503. The mean current calculation unit 61 calculates a signal corresponding to a mean current of the currents flowing in the individual inductive loads 4 in the respective channels Ch1 to ChN, and outputs the calculated signal to the block 503.

The block 503 is one block shared by all of the channels Ch1 to ChN, and includes selectors 62, 63, and a duty feedback control unit 64. A duty feedback control unit 64 sets a duty control value on the basis of signals (current command value, mean current detection value) of the respective channels Ch1 to ChN selected by the selectors 62 and 63, and outputs the set value to the block 504. The block 504 is a block disposed for each of the channels Ch1 to ChN, individually, and includes a duty holding unit 65, a post-correction holding unit 66, and a count comparison unit 67 for each of the channels Ch1 to ChN. The duty holding unit 65 holds a duty control value calculated by the duty feedback control unit 64, and outputs the held value to the selector 57 in the block 501.

The selector 57 selects the duty control value input for each of the channels Ch1 to ChN, and outputs the selected value to the calculation unit 56 as the duty ratio Duty. The pre-correction holding unit 58 stores the limit count value Rmprv input previously and the duty ratio selected by the selector 57 in association with the channels. The calculation unit 59 calculates the duty ratio and the peak value (limit count value) on the basis of the duty correction amount x calculated by the calculation unit 56 and the held value (limit count value Rmprv, the duty ratio Duty) in the pre-correction holding unit 58, and outputs the calculated values to the post-correction holding unit 66 in the block 504. The post-correction holding unit 66 holds the limit count value added by the calculation unit 59. The count comparison unit 67 compares the count value in the count unit 55 with the held value in the post-correction holding unit 66, outputs "H" when the output of the count unit 55 is lower than the held value of the post-correction holding unit 66, and outputs "L" when the output of the count unit 55 is equal to or higher than the held value in the post-correction holding unit 66. As a result, the PWM control unit 500 configured by the combination of the blocks 501 to 504 is configured by sequentially outputting the PWM pulses.

The operation of the above configuration will be described. The duty feedback control unit 64 calculates a duty command value on the basis of the command value from the current instruction unit 60 and the mean current of the flowing current in the inductive load 4 which is calculated by the mean current calculation unit 61, outputs the calculated value to the duty holding unit 65, and stores and holds the duty control value. In this situation, the calculation unit 56 calculates a duty correction amount x with the use of the duty command value held by the duty holding unit 65, the limit count value Rm input currently, and the limit count value Rmprv input previously. The calculation unit 59 corrects the held value (the duty ratio, the peak value (limit count value)) in the pre-correction holding unit 58 taking the duty correction amount x into consideration, and the comparison unit 67 generates and outputs the PWM pulse on the basis of the corrected held value.

Figure 10:
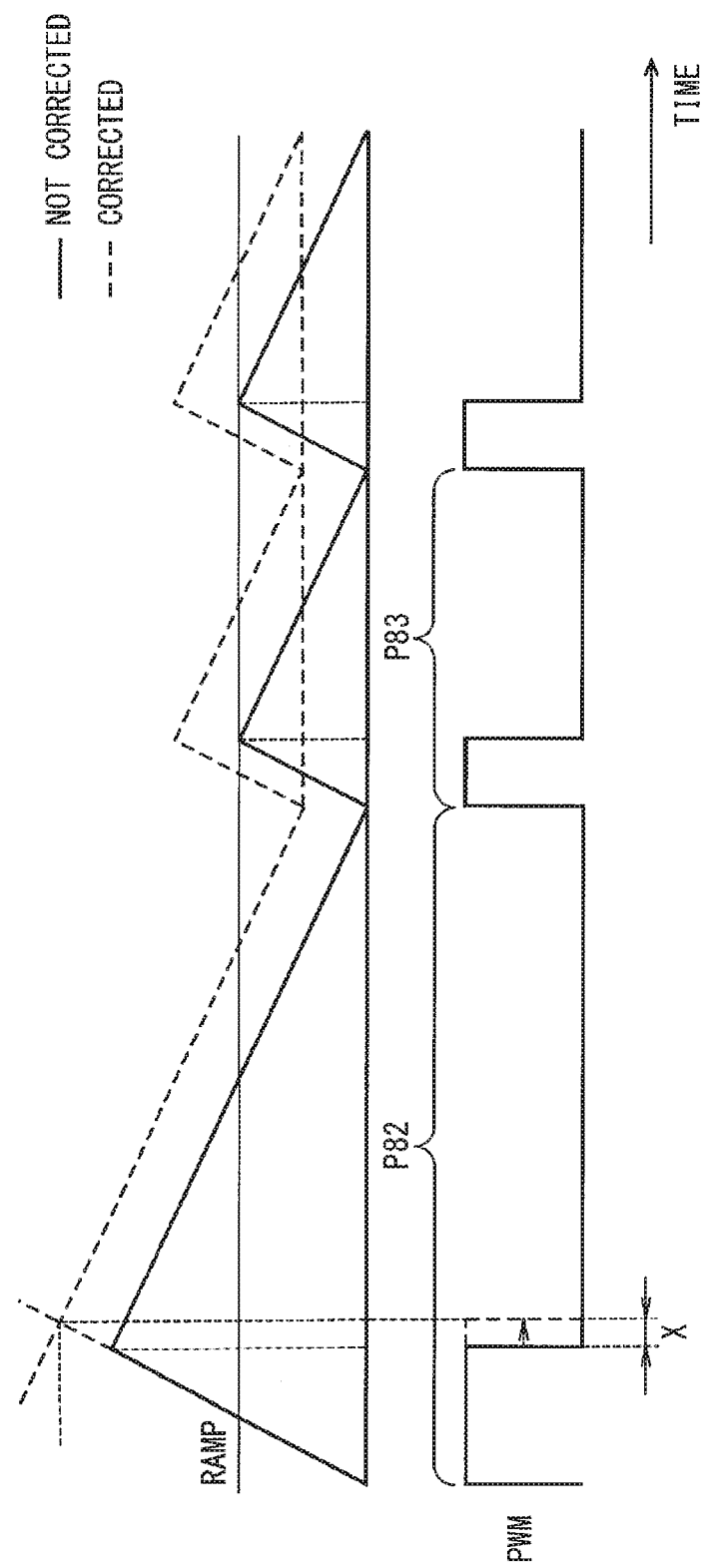
FIG. 10 is a timing chart schematically illustrating the operation.

As illustrated in FIG. 10, in the duty correction amount x, for example, when the microcomputer 2 sets the frequency command value to be higher, and sets the limit count value Rm input currently to be lower, the value Rmprv becomes higher than the value Rm. For that reason, the duty correction amount x becomes a positive value on the basis of Expression (2), and the "H" period can be increased (refer to the duty correction amount x and the middle PWM pulse P82 in FIG. 10). This makes it possible to increase the limit count value of the RAMP wave of the so-called middle PWM pulse P82, and to increase the peak value of the middle PWM pulse P82. Thereafter, because the limit count values Rmprv and Rmprvprv are sequentially shifted and input to lower values set to the value Rm, the mean current can be kept as stable as possible while the frequency is increased in the subsequent after PWM pulse P83.

Conversely, for example, when the microcomputer 2 sets the frequency command value to be lower, and sets the limit count value Rm input currently to be higher, the value Rmprv becomes lower than the value Rm. For that reason, the duty correction amount x becomes a negative value on the basis of Expression (2), and the "L" period can be increased. This makes it possible to decrease the limit count value of the RAMP wave of the PWM pulse P83, and to decrease the peak value of the after PWM pulse P83 (refer to the after PWM pulse P83 in FIG. 10). Even thereafter, because the limit count values Rmprv and Rmprvpry are held constant, the higher frequency is held, and the mean current can be kept as stable as possible.

With the application of the configuration illustrated in FIG. 9, the block 501 can be shared by a group of the channels Ch1 to ChK/ChK+1 to ChN. Because the duty holding unit 65 in the block 504 is controlled, independently, taking a variation of the current value caused by a time constant (inductance value L, internal resistance R) of the inductive load 4 and the external environment (for example, temperature, etc.) into account, the duty holding unit 65 is disposed in each of the channels Ch1 to ChN, individually. Therefore, the duty control value output by the duty feedback control unit 64 is corrected and controlled not for each of the channels Ch1 to ChN, but for each group of the channels Ch1 to ChK/ChK+1 to ChN before and after switching the frequency command value by the calculation unit 56, thereby being capable of controlling the mean current constantly.

According to the present embodiment, the block 501 is shared by the group of the channels Ch1 to ChK/Chk+1 to ChN. The calculation unit 56 in the block 501 corrects the duty control value held by the duty holding unit 65 in each of the channels Ch1 to ChN, individually, to thereby calculate the duty correction amount x. For that reason, the configuration of the block 501 (in particular, the calculation unit 56, the pre-correction holding unit 58, etc.) can be shared, and the circuit scale can be reduced.

Sixth Embodiment

Figure 11:
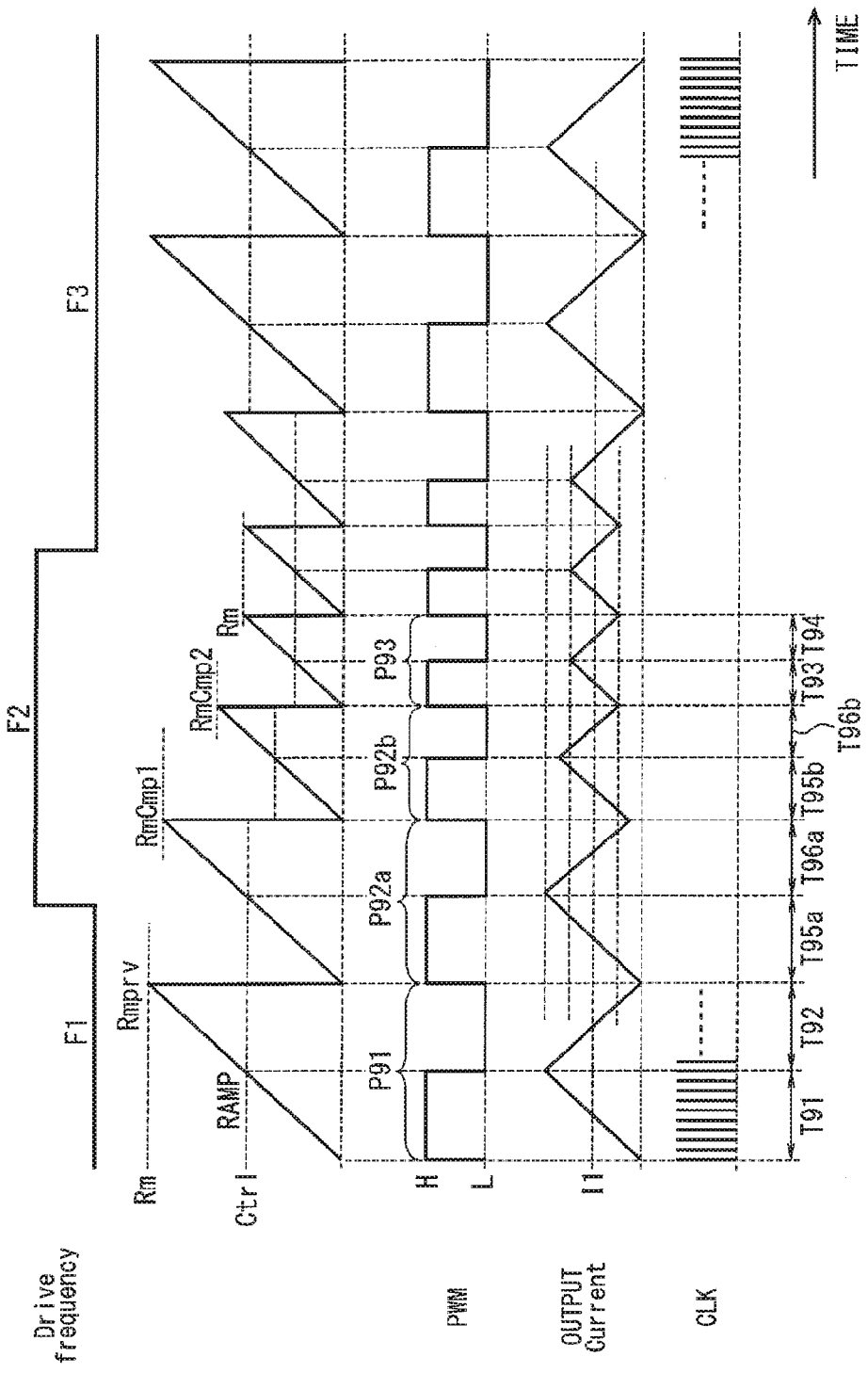
FIG. 11 is a timing chart schematically illustrating operation when multiple middle PWM pulses are provided between a forward PWM pulse and an after PWM pulse in a sixth embodiment.

FIG. 11 illustrates an additional illustrative view of a sixth embodiment. As illustrated in FIG. 11, multiple middle PWM pulses P92a and P92b may be provided between a forward PWM pulse P91 and an after PWM pulse P93. In this case, it is assumed that an "H" period of the forward PWM pulses P91 is a first period T91, an "L" period of the forward PWM pulse P91 is a second period T92, an "H" period of the after PWM pulse P93 is a third period T93, and an "L" period of the after PWM pulse P93 is a fourth period T94. Further, "H" periods of the middle PWM pulses P92a and P92b are fifth periods T95a and T95b, and "L" periods of the middle PWM pulses P92a and P92b are sixth periods T96a and T96b. In this case, when the frequency command value is highly changed from the first command value F1 to the second command value F2 (>F1), a control value Ctrl, and limit count values Rmprv, RmCmp1, RmCmp2, and Rm may be set to satisfy a relationship of T91≥T95a>T95b>T93, T92>T96a>T96b>T94. The same advantages as those in the above embodiments are obtained by the present embodiment.

Other Embodiments

For example, modifications and expansion described below can be performed without being limited to the above-mentioned embodiment. The RAMP wave generation block 17 and the count unit 55 may set, for example, an initial value of the counter to be higher than 0 in advance, and count the output pulses by subtraction. The mode and the system of the count are not limited to the mode and the system described in the above embodiments.

The "first command value" corresponds to the first command value F1 and the second command value F2 described in the description of the embodiments. In this case, the "second command value" corresponds to the second command value F2 or the third command value F3 described in the description of the embodiments.

The relationships of the respective first period (T1 . . . T91) to sixth period (T6 . . . T96) in the first to sixth embodiments described above are summarized so as to encompass all the relationships, and can be defined, expanded, or modified as follows. In other words, the fifth period (T5 . . . T95a, T95b) of the middle PWM pulse (P2 . . . P92) is set to a length between the first period (T1 . . . T91) of the forward PWM pulse (P1 . . . P91) and the third period (T3 . . . T93) of the after PWM pulse (P3 . . . P93) (including the first period but no third period). The sixth period (T6 . . . T96a, T96b) of the middle PWM pulse (P2 . . . P92) is set to a length between the fourth period (T4 . . . T94) of the after PWM pulse (P3 . . . P93) and the second period (T2 . . . T92) of the forward PWM pulse (P1 . . . P91) (including the fourth period but no second period). As a result, the mean current can be smoothly changed while a rapid change in the mean current of the flowing current flowing in the inductive load 4 is suppressed, and the mean current flowing in the inductive load 4 can be restrained from being overshot or undershot as much as possible.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A drive control device comprising:
an input unit that receives a frequency command value switched to spread a frequency of a PWM pulse; and
a control unit, wherein:
when the frequency command value input to the input unit is a first command value, the control unit sets a period, in which a current in an inductive load is controlled to rise according to the PWM pulse, to be a first period of the PWM pulse;
when the frequency command value input to the input unit is the first command value, the control unit sets a period, in which the current in the inductive load is controlled to fall according to the PWM pulse, to be a second period of the PWM pulse;
when the frequency command value input to the input unit is a second command value different from the first command value, the control unit sets a period, in which the current in the inductive load is controlled to rise according to the PWM pulse, to be a third period of the PWM pulse;
the third period is different from the first period;
when the frequency command value input to the input unit is the second command value, the control unit sets a period, in which the current in the inductive load is controlled to fall according to the PWM pulse, to be a fourth period of the PWM pulse;
the fourth period is different from the second period;
when the frequency command value input to the input unit is changed from the first command value to the second command value, and at least one of middle PMW pulses is disposed between a forward PWM pulse corresponding to the first command value and an after PWM pulse corresponding to the second command value, the control unit sets a fifth period in the at least one of middle PWM pulses corresponding to the first period of the forward PWM pulse to have a length between the first period in the forward PWM pulse and the third period in the after PWM pulse or the length equal to the first period and different from the third period;

when the frequency command value input to the input unit is changed from the first command value to the second command value, and the at least one of middle PMW pulses is disposed between the forward PWM pulse corresponding to the first command value and the after PWM pulse corresponding to the second command value, the control unit sets a sixth period in the at least one of middle PWM pulses corresponding to the second period of the forward PWM pulse to have a length between the fourth period in the after PWM pulse and the second period in the forward PWM pulse or the length equal to the fourth period and different from the second period; and the control unit controls a flowing current in the inductive load according to the PWM pulse.

2. The drive control device according to claim 1, wherein:

the control unit sets the fifth period in the at least one of middle PWM pulses to have the length equal to the length of the first period in the forward PWM pulse; and the control unit sets the sixth period in the at least one of middle PWM pulses to have the length between the second period and the fourth period.

3. The drive control device according to claim 1, wherein:

the control unit sets the sixth period in the at least one of middle PWM pulses to have the length equal to the length of the fourth period; and the control unit sets the fifth period in the at least one of middle PWM pulses to have the length between the first period and the third period.

4. The drive control device according to claim 1, wherein:

the at least one of middle PWM pulses is configured by one PWM pulse.

5. The drive control device according to claim 1, further comprising:

a measurement unit that includes a counter for counting a clock signal in each of the first period, the second period, the third period, the fourth period, the fifth period and the sixth period in the forward PWM pulse, the at least one of middle PWM pulses and the after PWM pulse; and a count frequency change unit, wherein:

when the frequency command value input to the input unit is changed from the first command value to the second command value, the measurement unit changes a count frequency of the counter using the count frequency change unit.

6. The drive control device according to claim 1, further comprising:

a measurement unit that includes a counter for counting a clock signal in each of the first period, the second period, the third period, the fourth period, the fifth period and the sixth period in the forward PWM pulse, the at least one of middle PWM pulses and the after PWM pulse; and a counter limit change unit, wherein:

a duty control value calculated based on a current command value and a flowing current in the inductive load is defined as Duty;

a limit counter value of the counter in the measurement unit is defined Rmprv when the frequency command value is the first command value;

the limit counter value of the counter in the measurement unit is defined as RmA when the frequency command value is the second command value;

the limit count value of the at least one of middle PWM pulses of the counter in the measurement unit is defined as RmCmp after the frequency command value is changed from the first command value to the second command value;

the counter limit change unit sets the limit count value to satisfy an equation of:

$$RmCmp = Rmpvy + \{(1-\text{Duty}) \times (RmA - Rmprv)\}/2.$$

7. The drive control device according to claim 1, the drive control device configured to drive the inductive load having a plurality of channels, the drive control device further comprising:

a holding unit that holds the duty command value, calculated based on the current command value and the flowing current in the inductive load, in each of the plurality of channels, individually; and a correction unit that corrects the duty command value, wherein:

an external device inputs a same frequency command value to the plurality of channels; and the correction unit is common among the plurality of channels.

\* \* \* \* \*